United States Patent
Tagare

(10) Patent No.: US 7,123,179 B1
(45) Date of Patent: *Oct. 17, 2006

(54) APPARATUS AND METHOD FOR DUTY CYCLE CONVERSION

(75) Inventor: Madhavi V. Tagare, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/771,129

(22) Filed: Feb. 2, 2004

Related U.S. Application Data

(63) Continuation of application No. 10/371,627, filed on Feb. 21, 2003, now Pat. No. 6,686,862.

(51) Int. Cl.
*H03M 1/12* (2006.01)

(52) U.S. Cl. ...................................... 341/155; 341/156

(58) Field of Classification Search ................ 341/155, 341/156; 331/111
See application file for complete search history.

(56) References Cited

U.S. PATENT DOCUMENTS

| | | | |
|---|---|---|---|
| 4,339,791 A * | 7/1982 | Mitchell .................... | 363/41 |
| 4,683,528 A * | 7/1987 | Snow et al. ............. | 363/21.15 |
| 5,508,664 A * | 4/1996 | Rizzo ......................... | 331/111 |
| 5,610,507 A * | 3/1997 | Brittan ....................... | 323/350 |
| 5,907,254 A | 5/1999 | Chang | |
| 6,016,075 A * | 1/2000 | Hamo ......................... | 330/10 |
| 6,060,922 A | 5/2000 | Chow et al. | |
| 6,114,890 A | 9/2000 | Okajima et al. | |
| 6,121,805 A | 9/2000 | Thamsirianunt et al. | |
| 6,323,706 B1 | 11/2001 | Stark et al. | |
| 6,448,828 B1 | 9/2002 | Stark et al. | |
| 6,472,918 B1 | 10/2002 | Mosinskis et al. | |
| 6,686,862 B1 * | 2/2004 | Tagare ........................ | 341/155 |
| 6,906,531 B1 * | 6/2005 | Mobley ...................... | 324/672 |
| 6,920,054 B1 * | 7/2005 | Florence et al. ............. | 363/41 |

\* cited by examiner

*Primary Examiner*—Rexford Barnie
*Assistant Examiner*—Joseph Lauture

(57) ABSTRACT

A reference signal generator for generating an output reference signal having a target duty cycle. The reference signal generator comprises a sawtooth generator for receiving an input reference signal having a reference frequency and generating a sawtooth waveform having the reference frequency. Comparison circuitry compares the sawtooth waveform to a reference voltage and generates the output reference signal. The output reference signal is Logic 1 when the sawtooth waveform is greater than the reference voltage and is Logic 0 when the sawtooth waveform is less than the reference voltage. Feedback circuitry determines a duty cycle of the output reference signal by comparing a first time period when the output reference signal is Logic 1 to a second time period when the output reference signal is Logic 0. The feedback circuitry adjusts a value of the reference voltage to cause the output reference signal to achieve the target duty cycle.

20 Claims, 3 Drawing Sheets

DUTY CYCLE SELECT

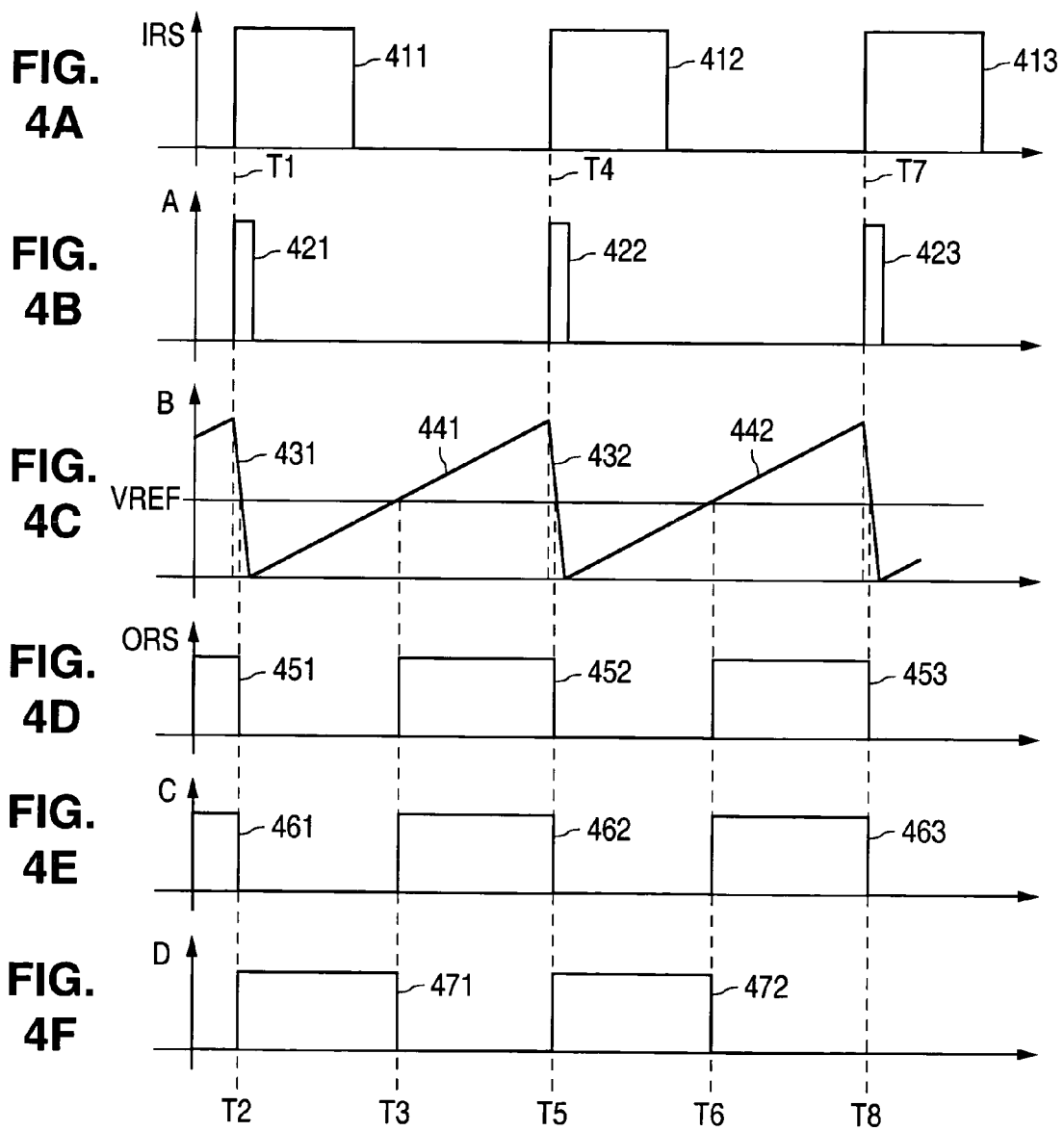

APPARATUS AND METHOD FOR DUTY CYCLE CONVERSION

This application is a continuation of prior U.S. patent application Ser. No. 10/371,627 filed on Feb. 21, 2003, now U.S. Pat. No. 6,686,862.

TECHNICAL FIELD OF THE INVENTION

The present invention is generally directed to reference signal generators for use in integrated circuits, and more specifically, to a reference signal generator that generates a reference signal having a highly accurate, adjustable duty signal.

BACKGROUND OF THE INVENTION

There are a myriad number of applications in which an integrated circuit (IC) requires a reference signal generator. These applications encompass both digital devices and analog devices. Reference signal generators typically supply clock signals that drive a processing circuit at a desired (or target) speed (or frequency). Often, one or more of the signal parameters (i.e., frequency, amplitude, duty cycle) of the reference signal is adjustable.

One important signal parameter is duty cycle. The duty cycle of a reference signal is the percentage of one cycle (or period) of the reference signal when the reference signal is high (or Logic 1). For example, a 200 KHz reference signal has a T=5 microsecond period. If the 200 KHz reference signal is high (e.g., Logic 1) for 2 microseconds and low (e.g., Logic 0) for 3 microseconds, the 200 KHz reference signal has a ⅖=40% duty signal. Similarly, if the 200 KHz reference signal is high for 2.5 microseconds and low for 2.5 microseconds, the 200 KHz reference signal has a 50% duty signal (i.e., a square wave).

However, many applications require high precision and operate under extreme temperature conditions. One typical example is a cell phone, which typically includes high-precision components and may operate in temperatures from sub-zero to 100+ degree. For these types of applications, a conventional reference signal generator may experience significant variations in the duty cycle of the reference signal across such a wide range of operating conditions.

Therefore, there is a need in the art for reference signal generators that generate reference signals having variable duty cycles. In particular, there is a need for reference signal generators that produce highly accurate duty cycles across a wide range of operating conditions.

SUMMARY OF THE INVENTION

To address the above-discussed deficiencies of the prior art, it is a primary object of the present invention to provide a reference signal generator for generating an output reference signal having a target duty cycle. According to an advantageous embodiment of the present invention, the reference signal generator comprises: 1) a sawtooth generator capable of receiving an input reference signal having a reference frequency and generating a sawtooth waveform having the reference frequency; 2) first comparison circuitry capable of comparing the sawtooth waveform to a reference voltage and generating the output reference signal, wherein the output reference signal is Logic 1 when the sawtooth waveform is greater than the reference voltage and the output reference signal is Logic 0 when the sawtooth waveform is less than the reference voltage; and 3) feedback circuitry capable of determining a duty cycle of the output reference signal by comparing a first time period when the output reference signal is Logic 1 to a second time period when the output reference signal is Logic 0, wherein the feedback circuitry adjusts a value of the reference voltage to cause the output reference signal to achieve the target duty cycle.

According to one embodiment of the present invention, the feedback circuitry comprises a first charging circuit capable of charging a first capacitor when the output reference signal is Logic 1 and discharging the first capacitor when the output reference signal is Logic 0.

According to another embodiment of the present invention, the feedback circuitry comprises a second charging circuit capable of charging a second capacitor when the output reference signal is Logic 0 and discharging the second capacitor when the output reference signal is Logic 1.

According to still another embodiment of the present invention, the feedback circuitry comprises an operational amplifier for generating the reference voltage, the operational amplifier having a non-inverting input coupled to the first capacitor and an inverting input coupled to the second capacitor, wherein the operational amplifier increases the reference voltage as a first charging voltage on the first capacitor increases with respect to a second charging voltage on the second capacitor and wherein the operational amplifier decreases the reference voltage as the first charging voltage on the first capacitor decreases with respect to the second charging voltage on the second capacitor.

According to yet another embodiment of the present invention, the non-inverting input of the operational amplifier is coupled to the first capacitor by a first selectable voltage divider resistor array.

According to a further embodiment of the present invention, the inverting input of the operational amplifier is coupled to the second capacitor by a second selectable voltage divider resistor array.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIGS. 4A–4F are timing diagrams illustrating the operation of the reference signal generator according to an exemplary embodiment of the present invention.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged electronic device that requires a reference signal generator that generates a reference signal having a highly accurate and variable duty cycle.

Figure 1:
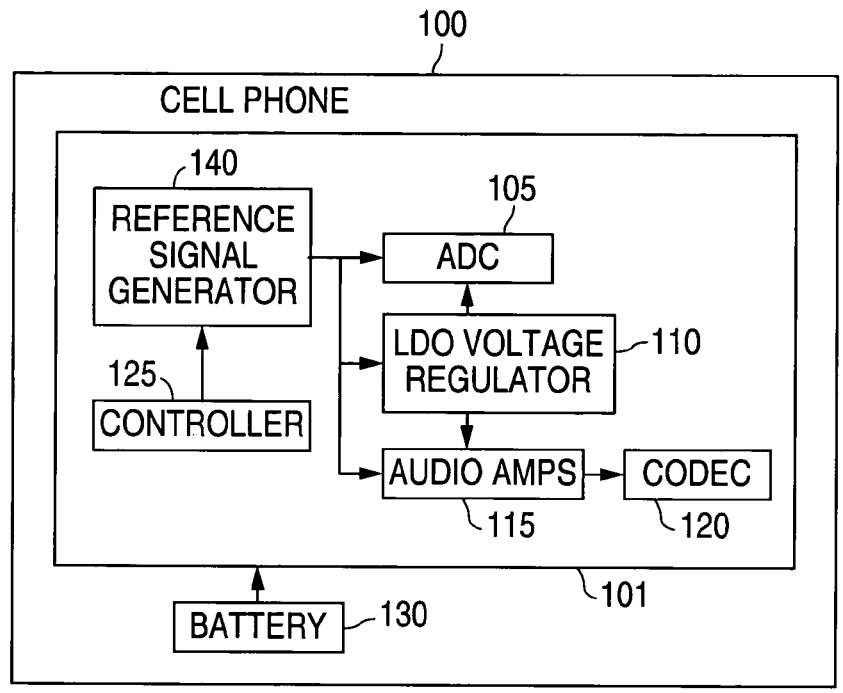
FIG. 1 illustrates a cellular telephone containing a reference signal generator according to the principles of the present invention.

FIG. 1 illustrates cellular telephone 100, which contains a reference signal generator having a variable duty cycle according to the principles of the present invention. Cellular telephone 100 contains printed circuit board (PCB) 101, which comprises analog-to-digital converter (ADC) 105, low-drop-out (LDO) voltage regulator 110, audio amplifiers 115, codec 120, controller 125, battery 130, and reference signal generator 140. Reference signal generator 140 provides a highly stable, temperature-insensitive reference signal having a programmable duty cycle to one or more of ADC 105, LDO voltage regulator 110, audio amplifiers 115 and codec 120, among other circuits. According to an exemplary embodiment of the present invention, controller 125 of cellular telephone 100 is capable of conserving power and prolonging the operating life of battery 120 by periodically shutting down reference signal generator 140, and many of the other electrical circuits in cellular telephone 100.

In the embodiment shown in FIG. 1, reference signal generator 140 is disposed in a cell phone. However, this is by way of illustration only and should not be construed so as to limit the scope of the present invention. Those skilled in the art will recognize that reference signal generator 140 or a similar reference signal generator according to the principles of the present invention may be implemented in a myriad number of integrated circuit applications.

Figure 2:
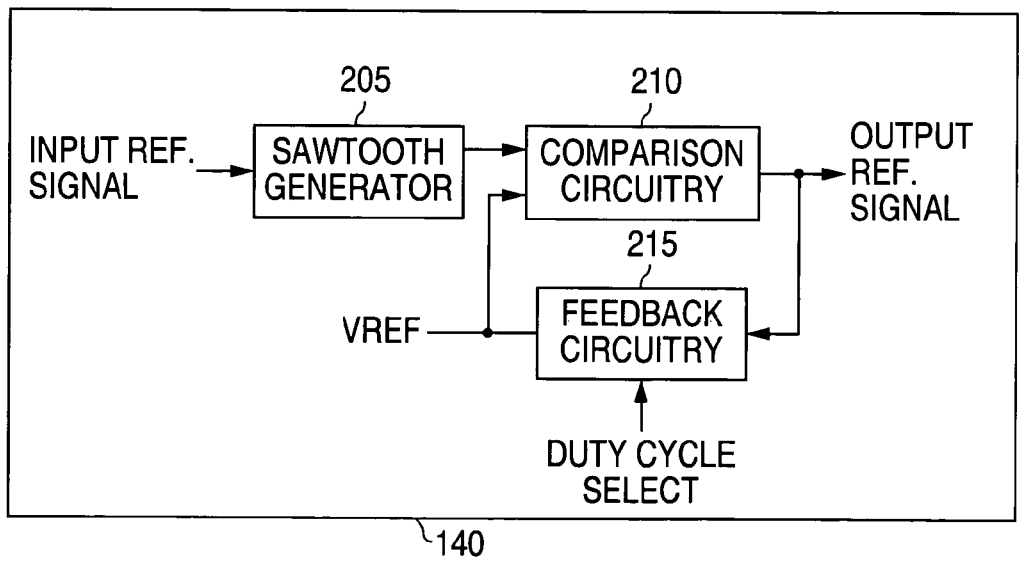
FIG. 2 is a high level block diagram illustrating the reference signal generator in FIG. 1 according to an exemplary embodiment of the present invention.

FIG. 2 is a block diagram illustrating reference signal generator 140 in high-level detail according to an exemplary embodiment of the present invention. Reference signal generator 140 comprises sawtooth generator 205, comparison circuitry 210, and feedback circuitry 215. Sawtooth generator 205 receives an input reference signal having a desired (or target) frequency, but which may not have the correct duty cycle. Comparison circuitry 210 generates an output reference signal that has the desired frequency, but also has the desired duty cycle.

According to the principles of the present invention, sawtooth generator 206 receives an input reference signal (such as a sequence of pulses) having a desired frequency and detects rising edges (or, alternatively, falling edges) of the input reference signal. Sawtooth generator 206 generates a rising ramp function between each rising edge (or falling edge) and is quickly reset to a low voltage by each rising edge (or falling edge). Thus, the output of sawtooth generator 205 is a conventional sawtooth waveform.

Comparison circuitry 210 compares the sawtooth waveform to a reference voltage, VREF, produced by feedback circuitry 215. A Duty Cycle Select value applied to feedback circuitry 215 determines the value of VREF. If the value of the sawtooth waveform is greater than the value of VREF, comparison circuitry 210 outputs a high voltage (or Logic 1) signal. If the value of the sawtooth waveform is less than the value of VREF, comparison circuitry 210 outputs a low voltage (or Logic 0) signal. Thus, whenever the sawtooth waveform crosses the VREF voltage level, the output reference signal switches from Logic 0 to Logic 1, or vice versa. In effect, this converts the sawtooth waveform to a rectangular waveform, where the duty cycle of the rectangular waveform is determined by the relative value of the sawtooth waveform compared to the VREF signal. By controlling the level of VREF, the duty cycle of the output reference signal can be controlled.

Those skilled in the art will recognize that in an alternate embodiment of the present invention the comparison operation performed by comparison circuitry 210 may produce logic outputs having inverted states depending on whether the sawtooth waveform is greater than or less than the reference voltage, VREF. Therefore, if the value of the sawtooth waveform is greater than the value of VREF, comparison circuitry 210 may output a low voltage (or Logic 0) signal (instead of a Logic 1 signal) and if the value of the sawtooth waveform is less than the value of VREF, comparison circuitry 210 may output a high voltage (or Logic 1) signal (instead of a Logic 0 signal).

Figure 3:
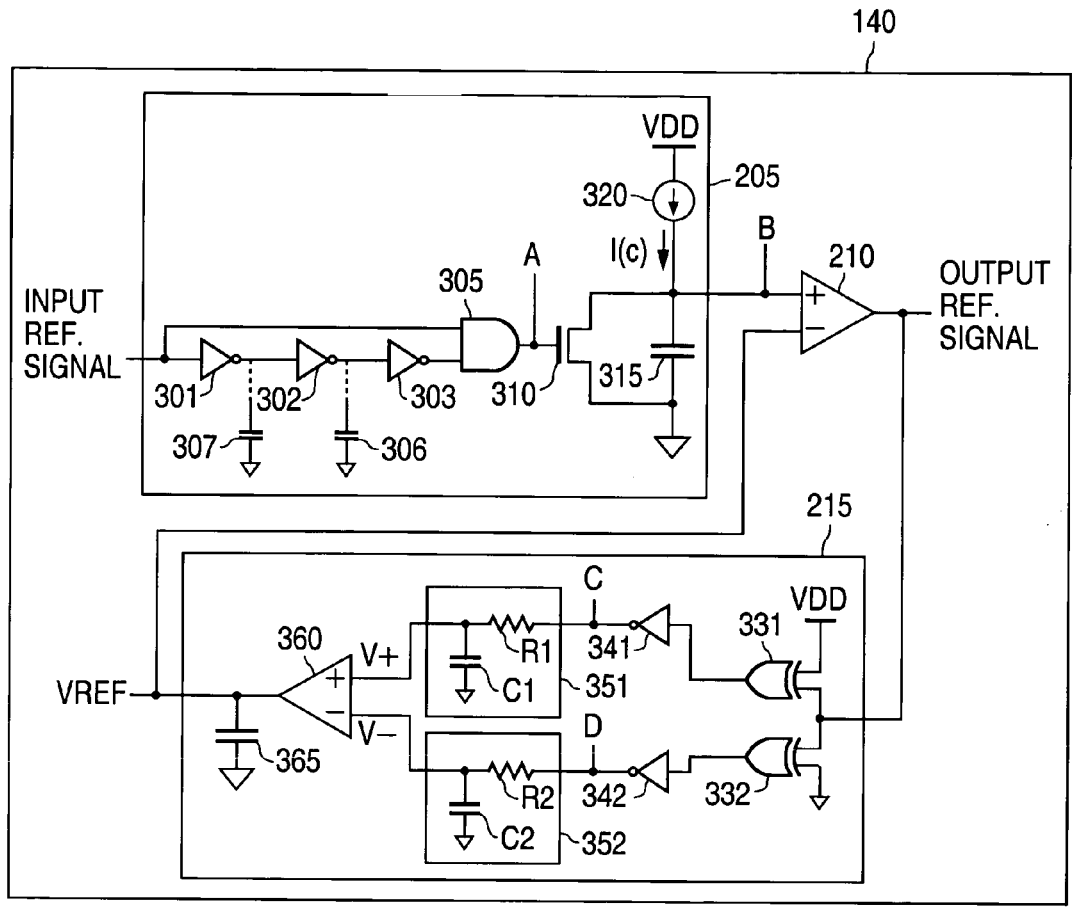
FIG. 3 illustrates the reference signal generator in FIG. 2 in greater detail according to an exemplary embodiment of the present invention.

FIG. 3 illustrates reference signal generator 140 in greater detail according to an exemplary embodiment of the present invention. Reference signal generator 140 comprises sawtooth generator 205, comparison circuitry 210, and feedback circuitry 215. Sawtooth generator comprises inverters 301, 302, and 303, AND gate 305, optional capacitors 306 and 307, N-channel transistor 310, capacitor 315 and current source 320. Comparison circuitry 210 comprises operational amplifier 210, which operates as a comparator. Feedback circuitry 215 comprises exclusive-OR (XOR) gates 331 and 332, inverters 341 and 342, RC circuits 351 and 352, operational amplifier 360 and capacitor 365.

In the exemplary embodiment in FIG. 3, it is assumed that the output reference cycle has a 50% duty cycle as a desired (or target) value. This simplifies a portion of feedback circuitry 215 that uses voltage-divider resistors (not shown in FIG. 3) to achieve duty cycles other than 50%.

FIGS. 4A through 4F are timing diagrams illustrating the operation of reference signal generator 140 according to an exemplary embodiment of the present invention. The operation of the circuitry in FIG. 3 will be explained with reference to the signal waveforms in FIGS. 4A through 4F.

The input reference signal (IRS) is illustrated in FIG. 4A. In the exemplary waveform, the input reference-signal is a rectangular waveform having a duty cycle that is less than the desired 50% duty cycle. Therefore, the widths of pulses 411, 412 and 413 are less than the time period between the pulses. The input reference signal is applied to one input of AND gate 305 and the input of inverter 301. Prior to each of its rising edges, the input reference signal has been Logic 0 for a significant period of time and the output of inverter 303 has been Logic 1 for a significant period of time. Thus, immediately prior to each rising edge of the input reference signal, the two inputs of AND gate 305 are Logic 0 and Logic 1 and the output of AND gate 305 (i.e., node A) is Logic 0.

After each rising edge of the input reference signal, both inputs of AND gate 305 are temporarily Logic 1. As a result, the output of AND gate 305 (i.e., node A) briefly goes to Logic 1. The gate delays of inverters 301, 302 and 303 and optional capacitors 306 and 307 prevent the output of inverter 303 from immediately going to Logic 1 after the rising edges of pulses 411, 412 and 413. When the rising edges of pulses 411, 412 and 413 ripple through inverters 301, 302 and 303, the output of inverter 303 finally goes to Logic 0 and the output of AND gate 305 (i.e., node A) goes back to Logic 0.

The end result is that each rising edge of the input reference signal generates a narrow pulse at node A. The width of each narrow pulse is determined by the propagation delays through inverters 301–303 and AND gate 305. FIG. 4B illustrates the waveform at node A. Pulse 421 is caused by the rising edge of pulse 411 occurring at time T1. Pulse 422 is caused by the rising edge of pulse 412 occurring at time T4. Pulse 423 is caused by the rising edge of pulse 413 occurring at time T7.

Node A, the output of AND gate 305, drives the gate of N-channel transistor 310. When node A is Logic 1, transistor 310 is turned on. When node A is Logic 0, transistor 310 is turned off. Constant current source 320 charges up capacitor 315 with charging current I(c) when transistor 310 if off. A constant current, such as charging current I(c), creates a rising ramp voltage on a capacitor, such as capacitor 315.

FIG. 4C illustrates the voltage on capacitor 315 (i.e., node B). The charging of capacitor 315 causes rising slope 441 after pulse 421 and the charging of capacitor 315 causes rising slope 442 after pulse 422. When node A goes high, the voltage on capacitor 315 rapidly discharges through transistor 310. Therefore, pulse 421 causes steep negative slope 431 and pulse 422 causes steep negative slope 432 in FIG. 4C. Thus, the pulses at node A generate the sawtooth waveform at node B in FIG. 4C.

The sawtooth waveform at node B is coupled to the non-inverting input of operational amplifier 210. The inverting input of operation amplifier 210 is coupled to the VREF output signal from feedback circuitry 215. Operational amplifier 210 operates as a comparator of the VREF signal and the sawtooth waveform. FIG. 4C illustrates the VREF signal and the sawtooth waveform at node B.

When the sawtooth waveform rises above the VREF signal (e.g., at times T3 and T6), the output reference signal (ORS) generated by operational amplifier 210 goes high (i.e., Logic 1). Correspondingly, when the sawtooth waveform falls below the VREF signal (e.g., at times T2, T5, and T8), the output reference signal (ORS) goes low (i.e., Logic 0). FIG. 4D illustrates the output reference signal at the output of operational amplifier 210. As FIG. 4D shows, operational amplifier 210 converts the sawtooth waveform to a rectangular waveform. The points at which the sawtooth waveform crosses the VERF signal level determines the duty cycle of the output reference signal.

In feedback circuitry 215, exclusive-OR (XOR) gate 331 compares the output reference signal (ORS) to VDD (i.e., Logic 1). When the output reference signal is Logic 1, the output of XOR gate 331 is Logic 0. When the output reference signal is Logic 0, the output of XOR gate 331 is Logic 1. Thus, XOR gate 331 inverts the output reference signal. The output of XOR gate 331 is inverted again by inverter 341 to produce a waveform at node C that is in phase with the output reference signal. FIG. 4E illustrates the waveform at node C.

Similarly, exclusive-OR (XOR) gate 332 compares the output reference signal (ORS) to ground (i.e., Logic 0). When the output reference signal is Logic 1, the output of XOR gate 332 is Logic 1. When the output reference signal is Logic 0, the output of XOR gate 332 is Logic 0. Thus, the output of XOR-gate 332 is in phase with the output reference signal. The output of XOR gate 332 is inverted by inverter 341 to produce a waveform at node D that is inverted with respect to the output reference signal. FIG. 4F illustrates the waveform at node D.

In the embodiment described above, the output reference signal is assumed to be at a quiescent operating point that maintains a 50% duty cycle (i.e., square wave). This being the case, the waveforms at node C and node D are square waves that are 180 degrees out of phase with each other. Node C drives RC circuit 351 and node D drives RC circuit 352.

RC circuit 351 comprises resistor R1 and capacitor C1. RC circuit 351 acts as an integrator. When node C is Logic 1 (i.e., during pulses 461–463), capacitor C1 charges and the voltage (V+) on the non-inverting input of operational amplifier 360 increases. When node C is Logic 0, capacitor C1 discharges and the voltage (V+) on the non-inverting input of operational amplifier 360 decreases. The amount of charge and discharge during a single cycle at node C is relatively small so that only small voltage fluctuations occur in the V+ voltage.

Similarly, RC circuit 352 comprises resistor R2 and capacitor C2. RC circuit 352 acts as an integrator. When node D is Logic 1 (i.e., during pulses 471 and 472), capacitor C2 charges and the voltage (V–) on the inverting input of operational amplifier 360 increases. When node D is Logic 0, capacitor C2 discharges and the voltage (V–) on the inverting input of operational amplifier 360 decreases. The amount of charge and discharge during a single cycle at node D is relatively small so that only small voltage fluctuations occur in the V– voltage.

At equilibrium, the V+ and V– voltages on the inputs of operational amplifier 360 are approximately equal and the VREF output of operational amplifier is stable. Since node C and node D are always in opposite states, the V+ voltage is always charging (i.e., increasing) when the V– voltage is discharging (i.e., decreasing) and the V+ voltage is always discharging (i.e., decreasing) when the V– voltage is charging (i.e., increasing).

Thus, when node C is Logic 1 and node D is Logic 0, the V+ voltage on the non-inverting input to operational amplifier 360 increases relative to the V– voltage on the inverting input to operation amplifier 360. This causes the output of operational amplifier 360 to increase and the VREF voltage on storage capacitor 365 increases. Correspondingly, when node C is Logic 0 and node D is Logic 1, the V+ voltage on the non-inverting input to operational amplifier 360 decreases relative to the V– voltage on the inverting input to operation amplifier 360. This causes the output of operational amplifier 360 to decrease and the VREF voltage on storage capacitor 365 decreases.

Since capacitor 365 is large and the V+ and V− voltages fluctuate only small amounts during a single cycle of the output reference signal, the amount of increase and decrease in the VREF voltage during a single cycle of the output reference signal also is very small. At the quiescent point, the output reference signal has a 50% duty cycle and the amount of charging and discharging of the V+ and V− voltages on capacitors C1 and C2 are equal and offsetting. As a result, the VREF voltage settles at a stable value that maintains the 50% duty cycle.

The operation of feedback circuitry 215 maintains the 50% duty cycle across variations in temperature, operating voltages and the like. If, for any reason, the sawtooth waveform at node B rises or falls with respect to the VREF signal, the duty cycle at the output reference signal will no longer be 50%. This means that the pulses at node C and node D will no longer be of equal duration. This causes unequal charging and discharging or capacitors C1 and C2. As a result, the VREF signal rises or falls in such as manner that the duty cycle of the output reference signal is restored to 50%.

For example, if the sawtooth waveform at node B rises with respect to the VREF signal, the duty cycle at the output reference signal will be greater than 50%. This increases the pulses widths of pulses 461, 462 and 463 at node C and decreases the pulse widths of pulses 471 and 472 at node D. As a result, node C charges capacitor C1 for relatively longer periods of time and the V+ voltage at the non-inverting input of operational amplifier 360 increase. At the same time, node D charges capacitor C2 for relatively shorter periods of time and the V− voltage at the inverting input of operational amplifier 360 decreases.

The increase in the V+ voltage and the decrease in the V− voltage result in an increase in the VREF voltage. As the VREF signal increases, the duty cycle at the output reference signal is restored to 50%.

The exemplary embodiment of the present invention illustrated in FIGS. 3 and 4 is designed to accurately maintain at 50%. However, reference signal generator 140 may be programmed to maintain other duty cycles by using precision resistors that operate as voltage dividers at the inputs of operational amplifier 360.

Figure 5:
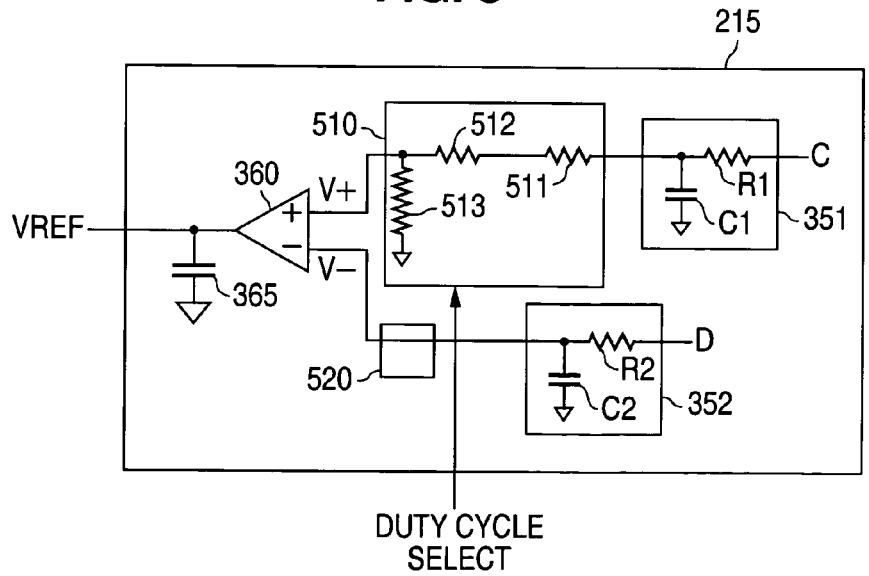
FIG. 5 illustrates selected portions of the reference signal generator in FIG. 3 in greater detail according to one embodiment of the present invention.

FIG. 5 illustrates in greater detail selected portions of feedback circuitry 215 in reference signal generator 140 according to an alternate embodiment of the present invention. In FIG. 5, resistor array 510 has been added between the output of RC circuit 351 and the non-inverting input of operational amplifier 360. Optionally, resistor array 520, which is similar to resistor array 510, may be added between the output of RC circuit 351 and the inverting input of operation amplifier 360. However, in the embodiment described below, it shall be assumed that resistor array 520 is set to zero ohms (i.e., a short-circuit).

The voltage on capacitor C1 is divided down by the resistors in resistor array 510 before being applied as the V+ voltage at the non-inverting input to operational amplifier 360. According to the principles of the present invention, resistor array 510 (and resistor array 520) comprises a matrix of switches and resistors that can be configured to a wide range of resistance values according to the Duty Cycle Select value applied to resistor array 510.

In the configuration shown in FIG. 5, resistor array 510 is configured so that resistors 511–513 are placed in series between the voltage on C1 and ground. Let the resistance of resistor 511 be represented as R511, let the resistance of resistor 512 be represented as R512, and let the resistance of resistor 513 be represented as R513. If resistors 511–513 are large (e.g., 2 MΩ) and R511=R512=R513, then the voltage V+ is given by:

$$V+ = [R513/(R511+R512+R513)]V(C1);$$

$$V+ = \tfrac{1}{3}V(C1).$$

where V(C1) is the voltage on capacitor C1. This configuration may be used to achieve a 75% duty cycle, as described below.

It is assumed that the output reference signal initially has a 50% duty cycle and is in equilibrium, so that V+ and V− are initially equal and V+=V(C1) and V−=V(C2). If the Duty Cycle Select value is suddenly changed so that resistors 511–513 are configured as shown in FIG. 5, the value of the V+ signal suddenly changes V+=⅓V(C1)=⅓(V−).

Since the non-inverting input of operational amplifier 360 is suddenly lower than the inverting input, the VREF voltage decreases at the output of operational amplifier 360. As the VREF signal decreases, the duty cycle of the output reference signal increases. This increases the duty cycle at node C and decreases the duty cycle at node D. The increased duty cycle at node C increases the voltage, V(C1), on capacitor C1 and the decreased duty cycle at node D decreases the voltage, V(C2), on capacitor C2.

Equilibrium is again reached when the V(C1) voltage is three (3) times larger than the V(C2) voltage, so that the V+ voltage at the non-inverting input of amplifier 360, after being divided by three (3) by resistor array 510, is equal to the V− voltage at the inverting input of amplifier 360. In order for the V(C1) voltage to be maintained at a level that is three times larger than the V(C2) voltage, node C must be charged three times longer than node D. This is achieved by a 75% duty cycle at the output reference signal, which causes a 75% duty cycle at node C and a 25% duty cycle at node D.

Those skilled in the art will recognize that a wide range of duty cycle values may be selected by modifying the voltage division performed by the resistors in resistor array 510 and resistor array 520. The accuracy of the selected duty cycle is determined by the accuracy of the resistors in resistor array 510 and resistor array 520. Closely matching these resistors minimizes variations in the operation of operational amplifiers 210 and 360 caused by changes in temperature and operating voltage.

Although the present invention has been described with an exemplary embodiment, various changes and modifications may be suggested to one skilled in the art. It is intended that the present invention encompass such changes and modifications as fall within the scope of the appended claims.

What is claimed is:

1. A reference signal generator, comprising:
    a sawtooth generator capable of generating a sawtooth waveform;
    comparison circuitry capable of comparing the sawtooth waveform to a reference voltage and generating an output signal based on the comparison; and
    feedback circuitry capable of determining a duty cycle of the output signal and adjusting the reference voltage to cause the output signal to achieve a target duty cycle;
    wherein the feedback circuitry is capable of determining the duty cycle of the output signal by comparing a first time period when the output signal is a high logic signal and a second time period when the output signal is a low logic signal.

2. The reference signal generator of claim 1, wherein the feedback circuitry comprises:
a first charging circuit capable of charging a first capacitor when the output signal is a high logic signal and discharging the first capacitor when the output signal is a low logic signal; and
a second charging circuit capable of charging a second capacitor when the output signal is a low logic signal and discharging the second capacitor when the output signal is a high logic signal.

3. The reference signal generator of claim 2, wherein the feedback circuitry further comprises an operational amplifier coupled to the first and second capacitors and capable of generating the reference voltage.

4. The reference signal generator of claim 3, wherein the operational amplifier is capable of:
increasing the reference voltage as a first charging voltage on the first capacitor increases with respect to a second charging voltage on the second capacitor; and
decreasing the reference voltage as the first charging voltage on the first capacitor decreases with respect to the second charging voltage on the second capacitor.

5. The reference signal generator of claim 3, wherein:
a non-inverting input of the operational amplifier is coupled to the first capacitor by one of: a first selectable voltage divider resistor array and a first resistor-capacitor circuit; and
an inverting input of the operational amplifier is coupled to the second capacitor by one of: a second selectable voltage divider resistor array and a second resistor-capacitor circuit.

6. A reference signal generator, comprising:
a sawtooth generator capable of generating a sawtooth waveform;
comparison circuitry capable of comparing the sawtooth waveform to a reference voltage and generating an output signal based on the comparison; and
feedback circuitry capable of determining a duty cycle of the output signal and adjusting the reference voltage to cause the output signal to achieve a target duty cycle, wherein the feedback circuitry comprises:
a first charging circuit capable of charging a first capacitor when the output signal is a high logic signal and discharging the first capacitor when the output signal is a low logic signal; and
a second charging circuit capable of charging a second capacitor when the output signal is a low logic signal and discharging the second capacitor when the output signal is a high logic signal.

7. The reference signal generator of claim 6, wherein the feedback circuitry further comprises an operational amplifier coupled to the first and second capacitors and capable of generating the reference voltage.

8. The reference signal generator of claim 7, wherein the operational amplifier is capable of:
increasing the reference voltage as a first charging voltage on the first capacitor increases with respect to a second charging voltage on the second capacitor; and
decreasing the reference voltage as the first charging voltage on the first capacitor decreases with respect to the second charging voltage on the second capacitor.

9. The reference signal generator of claim 7, wherein:
a non-inverting input of the operational amplifier is coupled to the first capacitor by one of: a first selectable voltage divider resistor array and a first resistor-capacitor circuit; and
an inverting input of the operational amplifier is coupled to the second capacitor by one of: a second selectable voltage divider resistor array and a second resistor-capacitor circuit.

10. A communication device, comprising:
a voltage regulator capable of generating a regulated output voltage;
an analog-to-digital converter capable of converting analog signals to digital signals; and
a reference signal generator capable of supplying an output signal having a target duty cycle, the reference signal generator comprising:
a sawtooth generator capable of generating a sawtooth waveform;
comparison circuitry capable of comparing the sawtooth waveform to a reference voltage and generating the output signal based on the comparison; and
feedback circuitry capable of determining a duty cycle of the output signal and adjusting the reference voltage to cause the output signal to achieve the target duty cycle.

11. The communication device of claim 10, wherein the comparison circuitry is capable of generating the output signal by one of:
generating a high logic signal when the sawtooth waveform is greater than the reference voltage and generating a low logic signal when the sawtooth waveform is less than the reference voltage; and
generating a low logic signal when the sawtooth waveform is greater than the reference voltage and generating a high logic signal when the sawtooth waveform is less than the reference voltage.

12. The communication device of claim 10, wherein the feedback circuitry is capable of determining the duty cycle of the output signal by comparing a first time period when the output signal is a high logic signal and a second time period when the output signal is a low logic signal.

13. The communication device of claim 10, wherein the feedback circuitry comprises:
a first charging circuit capable of charging a first capacitor when the output signal is a high logic signal and discharging the first capacitor when the output signal is a low logic signal; and
a second charging circuit capable of charging a second capacitor when the output signal is a low logic signal and discharging the second capacitor when the output signal is a high logic signal.

14. The communication device of claim 13, wherein the feedback circuitry further comprises an operational amplifier coupled to the first and second capacitors and capable of generating the reference voltage.

15. The communication device of claim 14, wherein the operational amplifier is capable of:
increasing the reference voltage as a first charging voltage on the first capacitor increases with respect to a second charging voltage on the second capacitor; and
decreasing the reference voltage as the first charging voltage on the first capacitor decreases with respect to the second charging voltage on the second capacitor.

16. The communication device of claim 14, wherein:
a non-inverting input of the operational amplifier is coupled to the first capacitor by one of: a first selectable voltage divider resistor array and a first resistor-capacitor circuit; and an inverting input of the operational amplifier is coupled to the second capacitor by one of: a second selectable voltage divider resistor array and a second resistor-capacitor circuit.

17. A method, comprising:

generating a sawtooth waveform;

comparing the sawtooth waveform to a reference voltage;

generating an output signal based on the comparison;

determining a duty cycle of the output signal; and adjusting the reference voltage to cause the output signal to achieve a target duty cycle;

wherein determining the duty cycle of the output signal comprises:

charging a first capacitor when the output signal is a high logic signal and discharging the first capacitor when the output signal is a low logic signal; and charging a second capacitor when the output signal is a low logic signal and discharging the second capacitor when the output signal is a high logic signal.

18. The method of claim 17, wherein adjusting the reference voltage comprises:

increasing the reference voltage as a first charging voltage on the first capacitor increases with respect to a second charging voltage on the second capacitor; and decreasing the reference voltage as the first charging voltage on the first capacitor decreases with respect to the second charging voltage on the second capacitor.

19. The method of claim 17, further comprising supplying the output signal for use by a circuit.

20. The method of claim 19, wherein supplying the output signal comprises supplying the output signal to at least one of: a voltage regulator, an analog-to-digital converter, and an audio amplifier in a communication device.

\* \* \* \* \*